United States Patent
Min et al.

(10) Patent No.: US 12,302,767 B2
(45) Date of Patent: May 13, 2025

(54) BUFFER LAYER IN MEMORY CELL TO PREVENT METAL REDEPOSITION

(71) Applicant: Taiwan Semiconductor Manufacturing Company, Ltd., Hsinchu (TW)

(72) Inventors: Chung-Chiang Min, Zhubei (TW); Chang-Chih Huang, Taichung (TW); Yuan-Tai Tseng, Zhubei (TW); Kuo-Chyuan Tzeng, Chu-Pei (TW); Yihuei Zhu, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/076,726

(22) Filed: Dec. 7, 2022

(65) Prior Publication Data
US 2023/0100433 A1    Mar. 30, 2023

Related U.S. Application Data

(63) Continuation of application No. 17/074,843, filed on Oct. 20, 2020, now Pat. No. 11,532,785.

(51) Int. Cl.
*H10N 70/00*    (2023.01)
*H10B 63/00*    (2023.01)
*H10N 70/20*    (2023.01)

(52) U.S. Cl.
CPC ............ *H10N 70/828* (2023.02); *H10B 63/20* (2023.02); *H10N 70/063* (2023.02); *H10N 70/231* (2023.02); *H10N 70/245* (2023.02); *H10N 70/826* (2023.02); *H10N 70/882* (2023.02); *H10N 70/883* (2023.02)

(58) Field of Classification Search
CPC .............................. H10N 70/00; H10B 63/00
See application file for complete search history.

(56) References Cited

U.S. PATENT DOCUMENTS

| | | |
|---|---|---|
| 2016/0359111 A1 | 12/2016 | Kim et al. |
| 2016/0365512 A1 | 12/2016 | Sung et al. |
| 2017/0162783 A1 | 6/2017 | Narayanan et al. |
| 2017/0250339 A1 | 8/2017 | Sim et al. |
| 2019/0305218 A1 | 10/2019 | Trinh et al. |
| 2020/0006652 A1 | 1/2020 | Cheng |
| 2020/0044148 A1 | 2/2020 | Trinh et al. |
| 2020/0075857 A1 | 3/2020 | Chou |

FOREIGN PATENT DOCUMENTS

| | | | |
|---|---|---|---|
| CN | 101425559 A | * | 5/2009 |
| KR | 20170023350 A | | 3/2017 |

OTHER PUBLICATIONS

Notice of Allowance dated Aug. 25, 2022 for U.S. Appl. No. 17/074,843.

* cited by examiner

*Primary Examiner* — Marvin Payen
(74) *Attorney, Agent, or Firm* — Eschweiler & Potashnik, LLC (57) ABSTRACT

Some embodiments relate to a memory device. The memory device includes a first electrode overlying a substrate. A data storage layer is disposed on the first electrode. A second electrode overlies the data storage layer. A buffer layer is disposed between the data storage layer and the second electrode.

20 Claims, 9 Drawing Sheets

BUFFER LAYER IN MEMORY CELL TO PREVENT METAL REDEPOSITION

REFERENCE TO RELATED APPLICATION

This Application is a Continuation of U.S. application Ser. No. 17/074,843, filed on Oct. 20, 2020, the contents of which are hereby incorporated by reference in their entirety.

BACKGROUND

Many modern day electronic devices contain electronic memory. Electronic memory may be volatile memory or non-volatile memory. Non-volatile memory is able to retain its stored data in the absence of power, whereas volatile memory loses its stored data when power is lost. Programmable metallization cell (PMC) random-access memory (RAM), which may also be referred to as Nanobridge or electrolytic memory, is one promising candidate for next generation non-volatile electronic memory due to advantages over current electronic memory. Compared to current non-volatile memory, such as flash random-access memory, PMCRAM typically has better performance and reliability. Compared to current volatile memory, such as dynamic random-access memory (DRAM) and static random-access memory (SRAM), PMCRAM typically has better performance and density, with lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A programmable metallization cell generally includes a data storage layer arranged between a top electrode and a bottom electrode. An active metal layer may be disposed between the data storage layer and the top electrode. During a set operation a set voltage is applied across the top and bottom electrodes, such that a conductive bridge is formed within the data storage layer (e.g., resulting in a low resistance state). While applying the set voltage, ions may travel from the active metal layer to the data storage layer, thereby forming the conductive bridge within the data storage layer. During a reset operation a reset voltage is applied across the top and bottom electrodes, such that the conductive bridge may at least be partially removed from the data storage layer (e.g., resulting in a high resistance state). While applying the reset voltage, ions may travel from the data storage layer to the active metal layer, thereby at least partially dissolving the conductive bridge within the data storage layer.

During fabrication of the programmable metallization cell, a memory cell stack is formed over a substrate. The memory cell stack comprises a top electrode layer, a bottom electrode layer, a data storage layer disposed between the top and bottom electrode layers, and an active metal layer disposed between the data storage layer and the top electrode layer. A hard mask layer is formed over the top electrode layer. Separate etch processes are subsequently performed to define top and bottom electrodes. For example, a first etch process (e.g., a first plasma etch process) is performed to define the top electrode by patterning the top electrode layer. The first etch process may expose an upper surface of the active metal layer and/or may over-etch into the active metal layer. Further, the first etch process may include exposing the top electrode layer and the active metal layer to one or more fluorine-based etchants (e.g., carbon tetrafluoride (e.g., $CF_4$), sulfur hexafluoride (e.g., $SF_6$), etc.). The one or more fluorine-based etchants may react with the active metal layer, thereby resulting in the formation of by-products (e.g., aluminum fluoride (e.g., $AlF_3$)) on the upper surface of the active metal layer and/or on sidewalls of the top electrode and hard mask layer. During a second etch process (e.g., a second plasma etch process) used to define the bottom electrode, the by-products from the first etch process may be etched and re-deposited onto sidewalls of the data storage layer. Since the by-products are conductive, the by-products may electrically short the top and bottom electrodes, thereby rendering the programmable metallization cell inoperable. Further, if left in place, the by-products can also lead to long-term reliability concerns, for example due to the by-products diffusing out to adjacent structures during subsequent annealing processes. Thus, a wet clean process (e.g., using cleaning solution(s) such as hydrofluoric acid and/or deionized water) may be utilized after the separate etch processes to reduce and/or remove the re-deposited by-products. However, the wet clean process may damage an interface(s) between the top and/or bottom electrodes and the data storage layer, thereby leading to peeling between the layers. This, in part, may impair a stability, endurance, and/or switching time of the programmable metallization cell.

In some embodiments of the present disclosure, to eliminate the formation and/or re-deposition of the by-products onto sidewalls of the memory cell stack, a buffer layer may be formed between the top electrode layer and the active metal layer prior to etching the memory cell stack. Thus, after the buffer layer is formed, a masking layer is formed over a center portion of the top electrode layer. A first etch process (e.g., a first plasma etch containing one or more fluorine-based etchants) is performed according to the masking layer to remove a portion of the top electrode layer, thereby defining a top electrode and exposing an upper surface of the buffer layer in regions laterally offset from the masking layer. Because the first etch process stops on the buffer layer, the first etch does not come into contact with the active metal layer and will not lead to the formation of by-products (e.g., aluminum fluoride (e.g., $AlF_3$)) between the one or more fluorine-based etchants and the active metal layer. A second etch process (e.g., a second plasma etch containing chlorine (e.g., $Cl_2$), boron trichloride (e.g., $BCl_3$), sulfur dioxide (e.g., $SO_2$), etc.) is performed on the buffer layer and underlying layers to define the programmable metallization cell. The second etch process utilizes one or more fluorine-free etchants, thereby preventing or mitigating the formation of by-products between the one or more fluorine-free etchants and layers of the memory cell stack underlying the buffer layer (e.g., the active metal layer, the data storage layer, etc.). Further, because by-products are not formed during the first etch process, the second etch process may not re-deposit conductive materials (e.g., the by-products from the first etch process) onto sidewalls of the programmable metallization cell. Thus, the buffer layer mitigates re-deposition of conductive materials onto sidewalls of the programmable metallization cell during fabrication, thereby preventing the top and bottom electrodes from being shorted together. This, in part, increases a performance, endurance, and/or reliability of the programmable metallization cell.

In addition, after the first etch process, a cleaning process (e.g., a wet clean process utilizing hydrofluoric acid and/or deionized water) may be performed on the top electrode and the upper surface of the buffer layer. The cleaning process may remove any unwanted by-products formed between the one or more fluorine-based etchants and the top electrode layer and/or the buffer layer. Because the buffer layer overlies the data storage layer and the active metal layer, the cleaning process may not damage an interface(s) between the data storage layer and the active metal layer and/or the bottom electrode layer. This mitigates peeling between the layers of the programmable metallization cell, thereby increasing a stability and/or endurance of the programmable metallization cell.

Figure 1A:
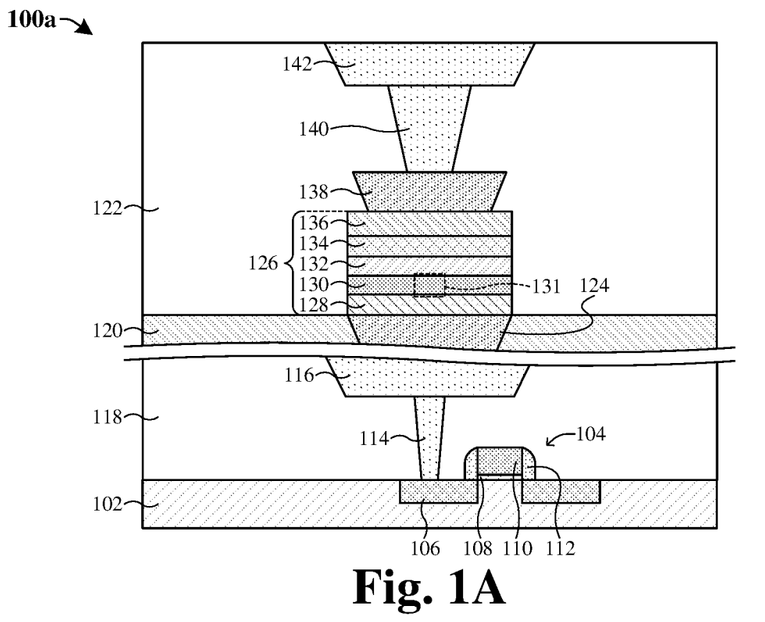
FIG. 1A illustrates a cross-sectional view of some embodiments of a memory device including a buffer layer overlying a data storage layer.

FIG. 1A illustrates a cross-sectional view of some embodiments of a memory device 100a having a memory cell 126 that includes a buffer layer 134 overlying a data storage layer 130. The memory cell 126 may, for example, be configured as a programmable metallization cell, a cation-type resistive random-access memory (RRAM) cell, or some other suitable type of RRAM cell. Note that the cation-type RRAM cell may, for example, be referred to as a programmable metallization cell (PMC) or a conductive-bridging random-access memory (CBRAM) cell.

The memory device 100a includes a substrate 102 and the memory cell 126 overlying the substrate 102. A lower interconnect dielectric structure 118 overlies the substrate 102. A lower conductive via 114 is disposed within the lower interconnect dielectric structure 118 and overlies the substrate 102. Further, a lower conductive wire 116 is disposed within the lower interconnect dielectric structure 118 and overlies the lower conductive via 114. A semiconductor device 104 may be disposed on and/or over the substrate 102. In some embodiments, the semiconductor device 104 may, for example, be configured as a transistor. In such embodiments, the semiconductor device 104 includes source/drain regions 106, a gate dielectric layer 108, a gate electrode 110, and a sidewall spacer 112. In various embodiments, the lower conductive via 114 overlies a source/drain region 106 of the semiconductor device 104.

A dielectric layer 120 is disposed over the lower interconnect dielectric structure 118. An upper interconnect dielectric structure 122 overlies the dielectric layer 120. The memory cell 126 is disposed within the upper interconnect dielectric structure 122 and overlies a bottom electrode via 124. In some embodiments, the memory cell 126 includes a first electrode 128, the data storage layer 130, an active metal layer 132, the buffer layer 134, and a second electrode 136. A top electrode via 138 overlies the second electrode 136. An upper conductive via 140 overlies the top electrode via 138, and an upper conductive wire 142 overlies the upper conductive via 140. In some embodiments, the active metal layer 132 may be configured as an ion reservoir layer, the first electrode 128 may be configured as a bottom electrode, and the second electrode 136 may be configured as a top electrode.

In various embodiments, the memory cell 126 is configured as a programmable metallization cell such that a conductive bridge (not shown) is selectively formable within a region 131 of the data storage layer 130. In such embodiments, during operation of the memory cell 126, the conductive bridge may be repeatedly formed and dissolved within the region 131 of the data storage layer 130 to change the memory cell 126 between a low resistance state and a high resistance state. While forming the conductive bridge, a set voltage is applied between the first and second electrodes 128, 136. The set voltage may induce oxidation of the active metal layer 132 and forms metal cations. Further, an electric field from the set voltage causes the metal cations to migrate to the data storage layer 130 and to reduce into the conductive bridge within the region 131. While dissolving or removing the conductive bridge, a reset voltage is applied between the first and second electrodes 128, 136. The reset voltage may induce oxidation of the conductive bridge and form metal cations. Further, an electric field from the reset voltage causes the metal cations to migrate to the active metal layer 132 and to reduce into the active metal layer 132.

The first and second electrodes 128, 136 and the active metal layer 132 are conductive. However, the active metal layer 132 is electrochemically active compared to the first and second electrodes 128, 136. Hence, the first and second electrodes 128, 136 have lower reactivities with oxygen than the active metal layer 132 and depend upon more energy to oxidize than the active metal layer 132. For example, the first and second electrodes 128, 136 may depend upon 5 or more electron volts (eV) to oxidize, whereas the active metal layer 132 may depend upon 3 or less eV to oxidize. Other eV values are, however, amenable. The first and second electrodes 128, 136 may, for example, be or comprise tungsten, titanium, tantalum, titanium nitride, tantalum nitride, some other suitable material(s), or any combination of the foregoing.

The data storage layer 130 may be a sold electrolyte for metal cations that result from oxidation of the active metal layer 132. For example, where the active metal layer 132 is or comprises aluminum, the data storage layer 130 may be a solid electrolyte for aluminum cations. In some embodiments, the data storage layer 130 is or comprises silicon oxide (e.g., $SiO_2$), hafnium oxide (e.g., $HfO_2$), silicon nitride (e.g., $SiN_x$), aluminum oxide (e.g., $Al_2O_3$), zirconium oxide (e.g., $ZrO_2$), tantalum oxide (e.g., $TaO_x$), titanium oxide (e.g., $TiO_x$), aluminum nitride, some other suitable dielectric(s), or any combination of the foregoing. Further, in some embodiments, the data storage layer 130 is or comprises germanium sulfur (e.g., GeS), germanium selenium (e.g., GeSe), germanium tellurium (e.g., GeTe), a metal oxide, amorphous silicon, some other suitable electrolyte(s), or any combination of the foregoing. In some embodiments, the active metal layer 132 may, for example, be or comprise aluminum, copper, zirconium, tellurium, some other suitable material(s), or any combination of the foregoing. In yet further embodiments, the active metal layer 132 may consist of or consist essentially of aluminum, copper, zirconium, or tellurium.

In various embodiments, the buffer layer 134 is disposed between the active metal layer 132 and the second electrode 136. In some embodiments, the buffer layer 134 may, for example, be or comprise ruthenium, carbon, some other suitable material(s), or any combination of the foregoing. In further embodiments, the buffer layer 134 may be or comprise a single material (e.g., ruthenium or carbon), such that the buffer layer 134 is a continuous layer of the single material. In yet further embodiments, the buffer layer 134 is conductive and is electrochemically inert compared to the active metal layer 132. In such embodiments, the buffer layer 134 has a lower reactivity with oxygen than the active metal layer 132 and depends upon more energy to oxidize than the active metal layer 132. In yet further embodiments, the buffer layer 134 may consist of or consist essentially of carbon or ruthenium.

In some embodiments, during fabrication of the memory cell 126, a first etch process is performed to form the second electrode 136. In various embodiments, the first etch process includes performing a plasma etch containing one or more fluorine-based etchants. By disposing the buffer layer 134 over the data storage layer 130, the formation and/or re-deposition of by-products from the active metal layer 132 and/or the second electrode 136 and the one or more fluorine-based etchants to the outer sidewalls of the memory cell 126 is mitigated during fabrication. By mitigating the re-deposition of the by-products from the buffer layer 134 and/or the second electrode 136, outer sidewalls of the memory cell 126 are not electrically shorted together by a conductive material, and thus the memory cell 126 can change between the high resistance state and the low resistance state. This, in part, increases a performance, endurance, and/or reliability of the memory cell 126.

In further embodiments, the second electrode 136 may be or comprise a diffusive species (e.g., titanium, tantalum, a metal nitride(s) of the foregoing, etc.). In yet further embodiments, if the diffusive species travels to the data storage layer 130 and/or the active metal layer 132, then the diffusive species may mitigate an ability for the memory cell 126 to switch between the high resistance state and the low resistance state. This may occur because the electric field from the reset voltage may be unable to remove the diffusive species from the data storage layer 130, thereby degrading an ability to dissolve and/or remove the conductive bridge. In some embodiments, the buffer layer 134 may be or comprise a diffusion barrier material, such as, for example, ruthenium, iridium, some other diffusion barrier material, or the like. Thus, in various embodiments, the second electrode 136 comprises a first conductive material and the buffer layer 134 comprises a second conductive material different from the first conductive material. In some embodiments, the buffer layer 134 is conductive and/or is configured to block or otherwise slow diffusion of the diffusive species to the data storage layer 130 and/or the active metal layer 132. In some such embodiments, the buffer layer 134 comprises a low diffusivity material (e.g., ruthenium, iridium, etc.) that blocks or otherwise slows diffusion of the diffusive species. For example, by virtue of the buffer layer 134 comprising a single continuous layer of the low diffusivity material it may have grain sizes that are smaller than grain sizes of the second electrode 136, such that the diffusive species may not travel across gain boundaries of the buffer layer 134 to the data storage layer 130. In further embodiments, the buffer layer 134 may not comprise grain boundaries (e.g., the buffer layer 134 may have an amorphous structure), thereby increasing a diffusion-path complexity for the diffusive species of the second electrode 136. Thus, the buffer layer 134 increases diffusion-path complexities for the diffusive species, thereby blocking or slowing diffusion of the diffusive species from the second electrode 136 to the data storage layer 130. This, in part, may increase an endurance and/or stability of the memory cell 126. Therefore, in some embodiments, the buffer layer 134 may be configured as and/or referred to as a diffusion barrier layer.

Figure 1B:
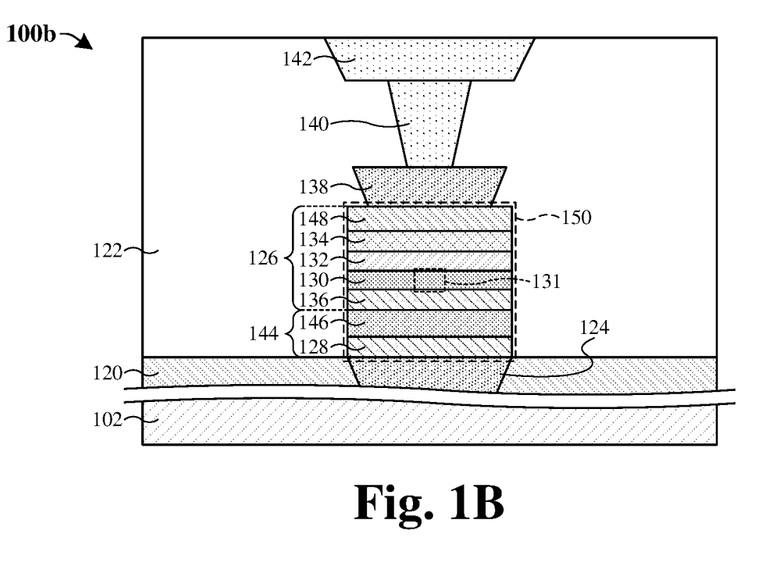
FIG. 1B illustrates a cross-sectional view of some embodiments of a one-selector one-memory cell (1S1MC) stack having a memory cell overlying a selector structure, in which the memory cell includes a buffer layer overlying a data storage layer.

FIG. 1B illustrates a cross-sectional view of some embodiments of a memory device 100b according to some alternative embodiments of the memory device 100a of FIG. 1A.

In some embodiments, the memory device 100b includes a memory cell 126 overlying a selector structure 144. The memory cell 126 includes the second electrode 136, the data storage layer 130, the active metal layer 132, the buffer layer 134, and a third electrode 148 overlying the buffer layer 134. The selector structure 144 includes a selector 146 overlying the first electrode 128. In various embodiments the memory cell 126 and the selector 146 form a one-selector one-memory cell (1S1MC) stack 150. The 1S1MC stack 150 is disposed over the bottom electrode via 124. In some embodiments, the third electrode 148 may, for example, be or comprise tungsten, titanium, tantalum, titanium nitride, tantalum nitride, some other suitable material(s), or any combination of the foregoing. Thus, in various embodiments, the first electrode 128, the second electrode 136, and the third electrode 148 may respectively comprise a same material (e.g., tungsten, titanium, titanium nitride, tantalum nitride, some other suitable material(s), or any combination of the foregoing). In some embodiments, the first electrode 128 may be referred to as a lower electrode, the second electrode 136 may be referred to as a middle electrode, and the third electrode 148 may be referred to as an upper electrode.

In some embodiments, the selector 146 may comprise one or more materials that are configured to have an electrical response that is similar to a diode (e.g., PN diode, PiN diode, Schottky diode, oxide semiconductor-oxide diodes, or the like). In such embodiments, the selector 146 has a threshold voltage that, if exceeded, allows current to flow through the selector 146, while if an applied voltage is less than the threshold voltage the selector 146 blocks current from flowing. Because the selector 146 is configured to selectively block current from flowing through the memory cell 126, the selector 146 is configured to selectively provide access to the memory cell 126.

In some embodiments, the selector 146 may be or comprise a threshold type selector such as, for example, an ovonic threshold switch (OTS). In some such embodiments, the selector 146 may comprise a binary material (e.g., SiTe, GeTe, CTe, BTe, ZnTe, AlTe, or the like), a ternary material (e.g., GeSeAs, GeSeSb, GeSbTe, GeSiAs, or the like), a quaternary material (e.g., GeSeAsTe, GeSeTeSi, GeSeTeAs, or the like), some other suitable material(s), or any combination of the foregoing. In other embodiments, the selector 146 may be or comprise a voltage conductive bridge (VCB) selector. In some such embodiments, the selector 146 may comprise layers of Ag and hafnium oxide (e.g., $HfO_2$), layers of Cu and hafnium oxide (e.g., $HfO_2$), layers of Al and silicon dioxide (e.g., $SiO_2$), layers of Ag and tantalum oxide (e.g., $TaO_2$), or the like. In various embodiments, the selector 146 may, for example, be or comprise boron, carbon, gallium, germanium, arsenic, selenium, nitrogen, some other suitable material(s), or any combination of the foregoing. In some embodiments, the selector 146 may be or comprise a threshold type selector and an overlying exponential type selector stacked onto one another. In yet other embodiments, the selector 146 may be or comprise a filament based selector, rectifier, varistor-type selector, doped-chalcogenide-based selector, Mott effect based selector, mixed-ionic-electronic-conductive (MIEC)-based selector, field-assisted-superliner-threshold (FAST) selector, a voltage conductive bridge (VCB) selector, an exponential type selector, or the like.

Figure 2A:
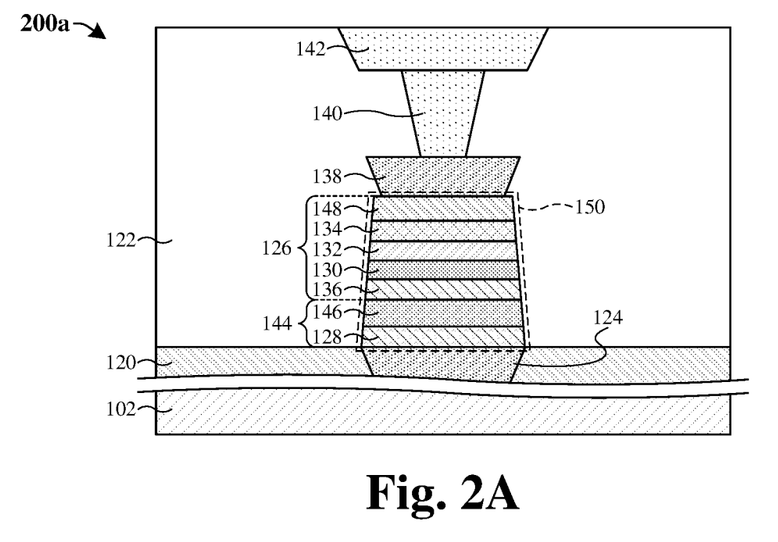
FIGS. 2A-2D illustrate cross-sectional views of various alternative embodiments of the memory device of FIG. 1A.

FIG. 2A illustrates a cross-sectional view of some embodiments of a memory device 200a having a 1S1MC stack 150 overlying a substrate 102.

In some embodiments, the 1S1MC stack 150 includes a memory cell 126 and a selector structure 144 overlying the substrate 102. In some embodiments, the substrate 102 may, for example, be or comprise a semiconductor body such as monocrystalline silicon/CMOS bulk, silicon-germanium (SiGe), a silicon-on-insulator (SOI), or another suitable material. A dielectric layer 120 overlies the substrate 102 and an upper interconnect dielectric structure 122 overlies the dielectric layer 120. Further, a bottom electrode via 124 is disposed within the dielectric layer 120 and underlies the memory cell 126. In some embodiments, the dielectric layer 120 may, for example, be or comprise silicon nitride, silicon carbide, silicon oxynitride, silicon oxycarbide, some other suitable material(s), or any combination of the foregoing. In yet further embodiments, the upper interconnect dielectric structure 122 may, for example, be or comprise silicon dioxide, a low-k dielectric, an extreme low-k dielectric, some other suitable material(s), or any combination of the foregoing. As used herein, a low-k dielectric may be, for example, a dielectric with a dielectric constant less than about 3.9, 2, or 1.5. In various embodiments, the bottom electrode via 124 may, for example, be or comprise copper, aluminum, tungsten, another suitable conductive material, or any combination of the foregoing.

In various embodiments, the selector structure 144 comprises the first electrode 128 and the selector 146, in which the first electrode 128 is disposed between the selector 146 and the bottom electrode via 124. In some embodiments, the memory cell 126 comprises the second electrode 136, the data storage layer 130, the active metal layer 132, the buffer layer 134, and the third electrode 148. In some embodiments, opposing sidewalls of the memory cell 126 and opposing sidewalls of the selector structure 144 are substantially aligned and are respectively slanted relative to a line (not shown) that is normal to a top surface of the bottom electrode via 124. In further embodiments, opposing straight sidewalls of the first electrode 128 and opposing straight sidewalls of the selector 146 are substantially aligned and are respectively slanted relative to the line that is normal to the top surface of the bottom electrode via 124. In yet further embodiments, opposing straight sidewalls of the second electrode 136, opposing straight sidewalls of the data storage layer 130, opposing sidewalls of the active metal layer 132, opposing sidewalls of the buffer layer 134, and opposing sidewalls of the third electrode 148 are substantially aligned and are respectively slanted relative to the line that is normal to the top surface of the bottom electrode via 124.

The top electrode via 138 is disposed within the upper interconnect dielectric structure 122 and overlies the memory cell 126. In some embodiments, the top electrode via 138 may, for example, be or comprise copper, aluminum, tungsten, another suitable conductive material, or any combination of the foregoing. The upper conductive via 140 and the upper conductive wire 142 are disposed within the upper interconnect dielectric structure 122. The upper conductive via 140 is disposed between the upper conductive wire 142 and the top electrode via 138. In some embodiments, the upper conductive via and wire 140, 142 may, for example, respectively be or comprise copper, aluminum, tungsten, ruthenium, titanium, tantalum, titanium nitride, tantalum nitride, another conductive material, or any combination of the foregoing.

Figure 2B:
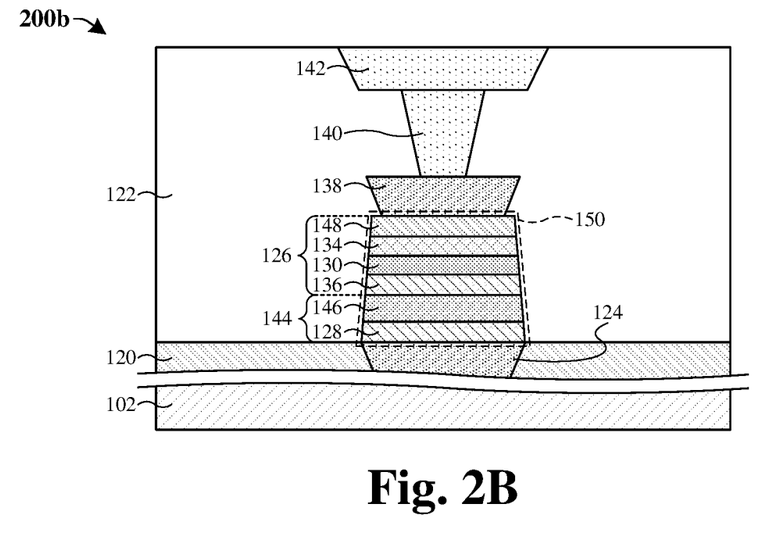

FIG. 2B illustrates a cross-sectional view of some embodiments of a memory device 200b according to some alternative embodiments of the memory device 200a of FIG. 2A, in which the active metal layer (132 of FIG. 2A) is omitted.

As illustrated in FIG. 2B, in some embodiments, a lower surface of the buffer layer 134 may directly contact an upper surface of the data storage layer 130 and an upper surface of the buffer layer 134 may directly contact a lower surface of the third electrode 148. The memory cell 126 is configured to store data and may be a non-voltage memory cell. In some embodiments, the memory cell 126 may be a resistive switching memory cell such as, for example an RRAM cell, a phase-change random-access memory (PCRAM) cell, etc. configured to store data based on a resistive state of the data storage layer 130. For example, the data storage layer 130 may have a high resistance state associated with a first data state (e.g., binary "0") or a low resistance state associated with a second data state (e.g., binary "1"). In some embodiments, the data storage layer 130 may, for example, be or comprise a chalcogenide, an oxide (e.g., silicon dioxide), a nitride, a high-k dielectric, some other suitable dielectric, or any combination of the foregoing. In various embodiments, when the memory cell 126 is configured as a PCRAM cell the data storage layer 130 may, for example, be or comprise a chalcogenide, which consist of at least one chalcogen ion (e.g., a chemical element in column VI of the period table), sulfur (S), selenium (Se), tellurium (Te), selenium sulfide (SeS), germanium antimony tellurium (GeSbTe), silver indium antimony tellurium (AgInSbTe), or the like. In further embodiments, the data storage layer 130 may comprise the chalcogenide doped with one or more dopants such as, for example, boron, carbon, some other suitable dopant(s), or any combination of the foregoing. In further embodiments, when the memory cell 126 is configured as an RRAM cell the data storage layer 130 may, for example, be or comprise a high-k dielectric such as aluminum oxide, hafnium oxide, tantalum oxide, another suitable high-k dielectric, or any combination of the foregoing. In further embodiments, the memory cell 126 may be a magnetoresistive random-access memory (MRAM) cell. In such an embodiment, the data storage layer 130 may comprise a magnetic tunnel junction (MTJ) configured to store data based on a magnetic orientation of the MTJ.

In some embodiments, during fabrication of the memory cell 126, the first etch process (e.g., a first plasma etch containing one or more fluorine-based etchants) is performed to form the second electrode 136. By disposing the buffer layer 134 on the data storage layer 130, the formation and/or re-deposition of by-products (e.g., aluminum fluoride (e.g., AlF$_3$)) from the data storage layer 130 and the one or more fluorine-based etchants to the outer sidewalls of the memory cell 126 is mitigated. By mitigating formation of the by-products on/within the data storage layer 130 an endurance and/or stability of the memory cell 126 may be increased. Further, by mitigating the re-deposition of the by-products from the data storage layer 130, outer sidewalls of the memory cell 126 are not electrically shorted together. This, in part, ensures the memory cell 126 can change between the high resistance state and the low resistance state, thereby increasing a performance and endurance of the memory cell 126.

Figure 2C:
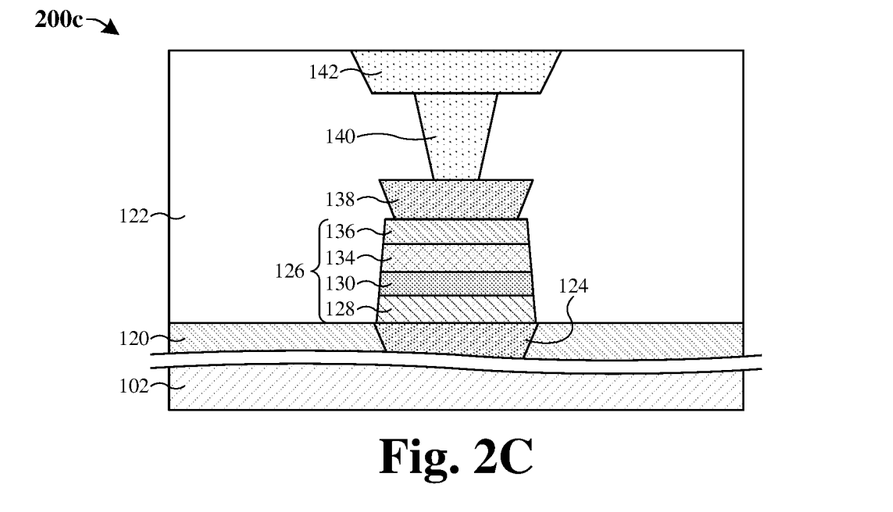

FIG. 2C illustrates a cross-sectional view of some embodiments of a memory device 200c according to some alternative embodiments of the memory device 200b of FIG. 2B, in which the selector structure (144 of FIG. 2B) is omitted. In such embodiments, the data storage layer 130 is disposed between the first electrode 128 and the second electrode 136, and the buffer layer 134 is disposed between the data storage layer 130 and the second electrode 136.

Figure 2D:
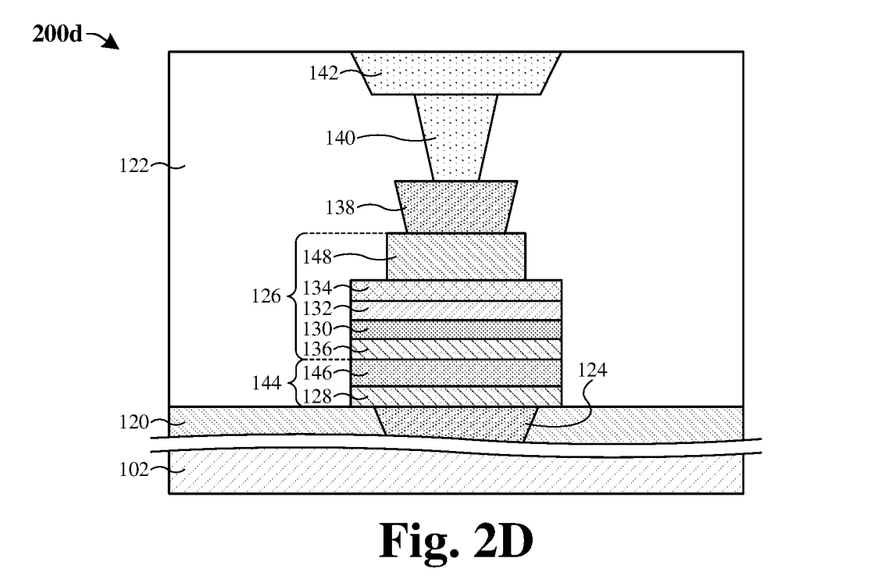

FIG. 2D illustrates a cross-sectional view of some embodiments of a memory device 200d according to some alternative embodiments of the memory device 200a of FIG. 2A, in which a maximum width of the third electrode 148 is less than a width of the buffer layer 134.

Figure 3A:
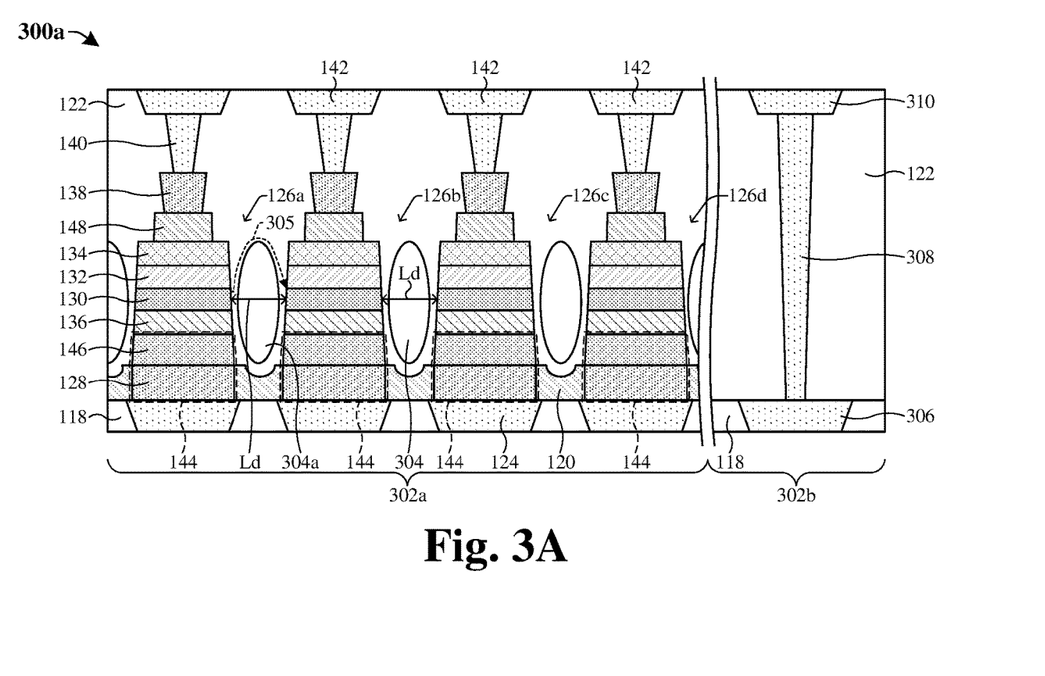
FIGS. 3A-3B illustrate cross-sectional views of various embodiments of a memory device including an embedded memory region comprising a plurality of memory cells and a logic region laterally adjacent to the embedded memory region.

FIG. 3A illustrates a cross-sectional view of some embodiments of a memory device 300a including an embedded memory region 302a comprising a plurality of memory cells 126a-d and a logic region 302b laterally adjacent to the embedded memory region 302a.

In some embodiments, the embedded memory region 302a comprises a dielectric layer 120 disposed over a lower interconnect dielectric structure 118. In various embodiments, the dielectric layer 120 may be referred to as an etch stop layer. The plurality of memory cells 126a-d is disposed laterally within the embedded memory region 302a and overlies the lower interconnect dielectric structure 118. In various embodiments, each one of the memory cells 126a-d includes a second electrode 136, a data storage layer 130, an active metal layer 132, a buffer layer 134, and a third electrode 148. In yet further embodiments, each one of the memory cells 126a-d may be configured as the memory cell 126 is illustrated and/or described in FIGS. 1A-2D. In further embodiments, each one of the memory cells 126a-d directly overlies a corresponding selector structure 144, such that each one of the memory cells 126a-d and the corresponding selector structure 144 are part of a 1S1MC stack. In some embodiments, the selector structure 144 comprises a selector 146 overlying a first electrode 128. In yet further embodiments, the active metal layer 132 of each one of the memory cells 126a-d may be omitted (not shown), such that the buffer layer 134 directly contacts an upper surface of the data storage layer 130 (e.g., see FIG. 2B). In some such embodiments, each one of the memory cells 126a-d may be configured as an RRAM cell, a PCRAM cell, an MRAM cell, or the like.

The upper interconnect dielectric structure 122 may, for example, be or comprise a dielectric material such as silicon dioxide, hydrogen-containing silicon oxycarbide (SiCOH), a low-k dielectric, an extreme low-k dielectric, other suitable dielectric material(s), or any combination of the foregoing. An effective dielectric constant of the upper interconnect dielectric structure 122 is a function of the dielectric material the structure is comprised of and the physical structure of the structure. For example, the upper interconnect dielectric structure 122 may have porosity and/or a plurality of air-gaps 304 that reduces the effective dielectric constant of the upper interconnect dielectric structure 122. In some embodiments, porosity is void space that is distributed throughout the dielectric material, whereas air-gaps are larger voids in the dielectric layer that would otherwise be filled by the dielectric material. The air-gaps 304 may be referred to as voids, pores, openings, or the like. In some embodiments, the upper interconnect dielectric structure 122 may have an effective dielectric constant within a range of about 2 to 3.6 or another suitable range. In yet further embodiments, a porosity of the upper interconnect dielectric structure 122 may, for example, be within a range of about 0.1% to 40% or another suitable value. The air-gaps 304 are disposed between adjacent memory cells within the plurality of memory cells 126a-d and may be configured to reduce the effective dielectric constant of the upper interconnect dielectric structure 122, thereby reducing a capacitance between adjacent conductive structures (e.g., layers of the memory cells 126a-d) within the upper interconnect dielectric structure 122. This, in part, is because a dielectric constant of each air-gap 304 is about 1. Thus, by introducing the air-gaps 304 between the plurality of memory cells 126a-d, an RC delay between adjacent conductive structures within the upper interconnect dielectric structure 122 is decreased, thereby increasing a performance and reliability of the memory device 300a.

In an effort to increase the number of devices disposed over the substrate 102, feature sizes of the memory cells 126a-d may be reduced and/or a lateral distance Ld between adjacent memory cells in the plurality of memory cells 126a-d may be reduced. In yet further embodiments, during operation of the memory cells 126a-d, heat may accumulate within and/or around the data storage layer 130 while performing set and/or reset operations on each memory cell 126a-d. However, in an embodiment where the air-gaps 304 are omitted (not shown), as the lateral distance Ld is decreased, heat from, for example, a first memory cell 126a may traverse the lateral distance Ld to a second memory cell 126b that is laterally adjacent to the first memory cell 126a. In such embodiments, the lateral distance Ld may be referred to as a thermal conduction path. This results in thermal cross-talk between the first and second memory cells 126a-b, where heat from the first memory cell 126a radiates to the second memory cell 126b. The thermal cross-talk may result in high heat accumulating around the data storage layer 130 of each memory cell 126a-d, thereby resulting in a leakage of charge (i.e., leakage current) across each memory cell 126a-d, inconsistent data states across the memory cells 126a-d, and/or peeling between layers within each one of the memory cells 126a-d. This, in part, may reduce energy efficiency of the memory cells 126a-d, reduce a number of set and/or reset operations that may be performed on each memory cell 126a-d, and/or limit a size of the memory cells 126a-d. In an embodiment according to the present disclosure, by disposing the air-gaps 304 between adjacent memory cells in the plurality of memory cells 126a-d thermal conduction paths (i.e., paths in which the heat travels) between the adjacent memory cells are increased. For example, by disposing a first airgap 304a between the first memory cell 126a and the second memory cell 126b, heat from the first memory cell 126a may traverse a first thermal conduction path 305 to the second memory cell 126b. This is because a thermal conductivity of each air-gap 304 is less than a thermal conductivity of the dielectric material of the upper interconnect dielectric structure 122. In various embodiments, the thermal conduction path between adjacent memory cells in the plurality of memory cells 126a-d is greater than the lateral distance Ld. For example, the first thermal conduction path 305 is greater than the lateral distance Ld between the first and second memory cells 126a-b. Thus, by disposing the air-gaps 304 between adjacent memory cells in the plurality of memory cells 126a-d thermal cross-talk between the plurality of memory cells 126a-d is decreased, thereby increasing an endurance of the memory cells 126a-d and reducing inconsistent data states across the plurality of memory cells 126a-d.

In various embodiments, each one of the memory cells 126a-d are configured as a PCRAM cell such that the data storage layer 130 of each memory cell 126a-d may be or comprise a phase change element (PCE) configured to switch between a crystalline phase and an amorphous phase. In such embodiments, the active metal layer 132 may be omitted (not shown). Further, the PCE may, for example, be or comprise a chalcogenide. During operation of the memory cells 126a-d, the bottom electrode via 124, the first electrode 128, and/or the second electrode 136 may be configured as a heating structure that is configured to apply heat to the PCE to change the PCE between the amorphous phase and the crystalline phase. For example, changing the PCE to the crystalline phase (e.g., performing a set operation) may be performed at a low temperature (e.g., about 460-500 kelvin (K)), and changing the PCE to the amorphous phase (e.g., performing a reset operation) may be performed at a high temperature (e.g., about 900K). The crystalline phase may correspond to a low resistance state (e.g., binary "1") and the amorphous phase may correspond to a high resistance state (e.g., binary "0"). By virtue of the air-gap 304 being disposed between the plurality of memory cells 126a-d, thermal isolation between the memory cells 126a-d is increased, thereby decreasing inaccurate data states of each memory cell 126a-d. For example, the first air-gap 304a may reduce thermal cross-talk between the first and second memory cells 126a-b, such that heat from a reset operation performed on the first memory cell 126a is impeded from changing a data state of the second memory cell 126b. This increases an endurance and performance of the memory device 300a.

The logic region 302b comprises a bottom interconnect via 306 disposed within the lower interconnect dielectric structure 118. A second conductive via 308 is disposed within the upper interconnect dielectric structure 122 and overlies the bottom interconnect via 306. In some embodiments, the second conductive via 308 may, for example, be or comprise ruthenium, copper, aluminum, titanium, tantalum, titanium nitride, tantalum nitride, another conductive material, or any combination of the foregoing. A second conductive wire 310 is disposed within the upper interconnect dielectric structure 122 and overlies the second conductive via 308. In further embodiments, the second conductive wire 310 may, for example, be or comprise ruthenium, copper, aluminum, titanium, tantalum, titanium nitride, tantalum nitride, another conductive material, or any combination of the foregoing.

Figure 3B:
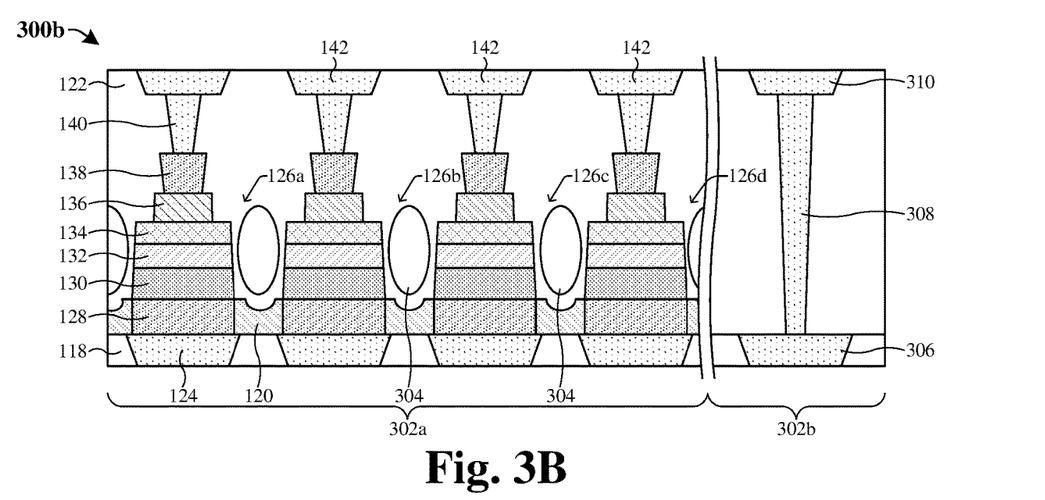

FIG. 3B illustrates a cross-sectional view of some embodiments of a memory device 300b corresponding to some alternative embodiments of the memory device 300a of FIG. 3A, in which the selector structure (144 of FIG. 3A) is omitted. In yet further embodiments, the active metal layer 132 of each memory cell 126a-d may be omitted (not shown), such that the buffer layer 134 directly contacts an upper surface of the data storage layer 130 (e.g., see FIG. 2C). In some such embodiments, each one of the memory cells 126a-d may be configured as an RRAM cell, a PCRAM cell, an MRAM cell, or the like.

Figure 4A:
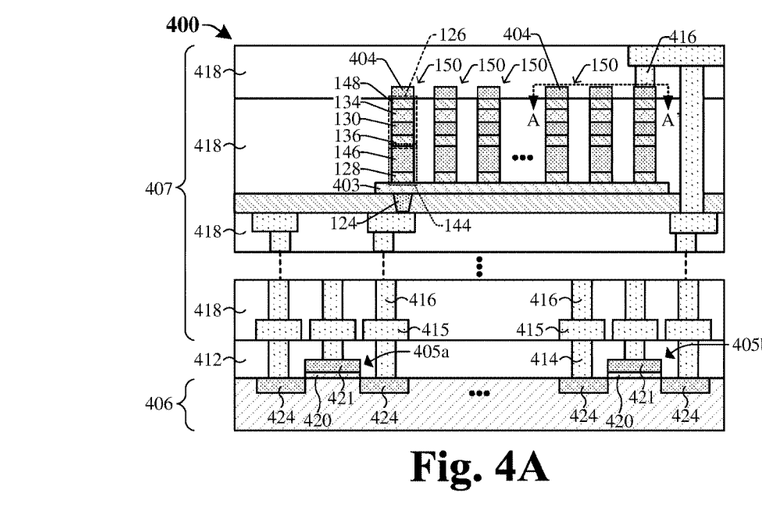
FIGS. 4A-4C illustrate various views of some embodiments of an integrated circuit (IC) including a plurality of 1S1MC stacks disposed between a plurality of bit lines and a plurality of word lines.
Figure 4B:
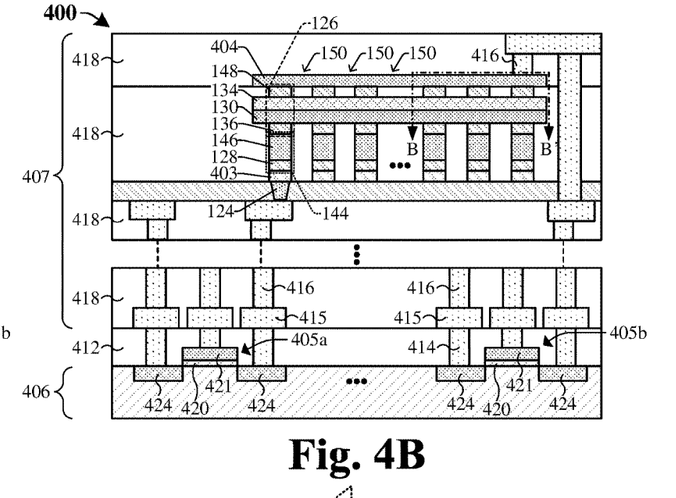
Figure 4C:
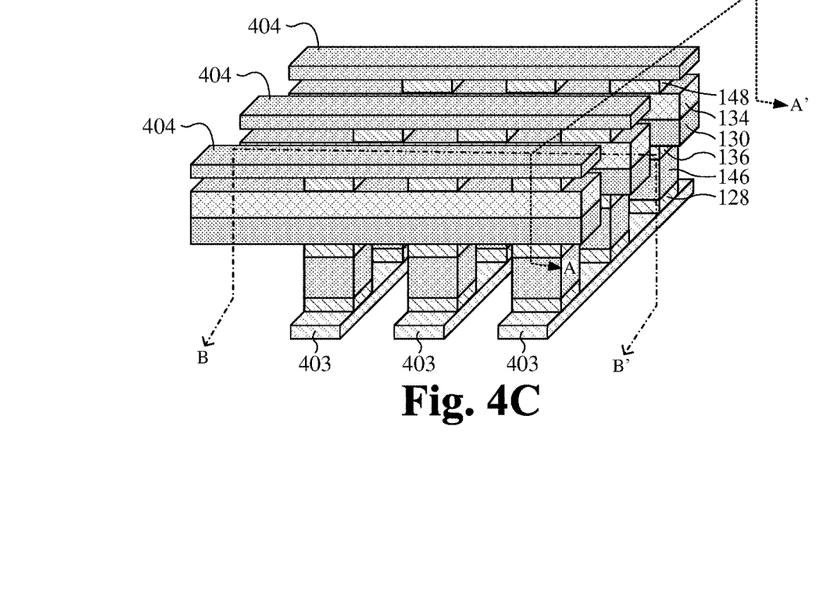

FIGS. 4A-4C illustrate various views of some embodiments of an integrated circuit (IC) 400 having a plurality of one-selector one-memory cell (1S1MC) stacks 150 disposed between a plurality of word lines 403 and a plurality of bit lines 404. FIG. 4C illustrates a schematic view of some embodiments of the plurality of 1S1MC stacks 150. FIG. 4A illustrates a cross-sectional view of some embodiments of the IC 400 taken along line A-A' of FIG. 4C. FIG. 4B illustrates a cross-sectional view of some alternative embodiments of the IC 400 taken along line B-B' of FIG. 4C.

The IC 400 comprises a first metal-oxide-semiconductor field-effect transistor (MOSFET) 405a and a second MOSFET 405b disposed on/within a semiconductor substrate 406. The first and second MOSFETs 405a-b respectively comprise a pair of source/drain regions 424 disposed in the semiconductor substrate 406 and laterally spaced apart. A gate dielectric layer 420 is disposed over the semiconductor substrate 406 between the individual source/drain regions 424, and a gate electrode 421 is disposed over the gate dielectric layer 420.

An inter-level dielectric (ILD) layer 412 is disposed over the first and second MOSFETs 405a-b and the semiconductor substrate 406. The ILD layer 412 comprises one or more ILD materials. In some embodiments, the ILD layer 412 may be or comprise one or more of a low-k dielectric layer, an extreme low-k dielectric layer, an oxide layer (e.g., a silicon dioxide layer), or the like. Further, conductive contacts 414 are disposed within the ILD layer 412. The conductive contacts 414 extend through the ILD layer 412 to the gate electrode 421 and the pair of source/drain regions 424. In various embodiments, the conductive contacts 414 may, for example, be or comprise copper, tungsten, aluminum, titanium, tantalum, some other suitable material(s), or any combination of the foregoing.

An interconnect structure 407 is disposed over the semiconductor substrate 406. The interconnect structure 407 comprises a plurality of inter-metal dielectric (IMD) layers 418, a plurality of conductive wires 415, and a plurality of conductive vias 416. The plurality of conductive wires 415 and the plurality of conductive vias 416 are disposed within the plurality of IMD layers 418. The conductive wires 415 and the conductive vias 416 are configured to provide electrical connections between various devices disposed throughout the IC 400. In some embodiments, the IMD layers 418 may each comprise a low-k dielectric layer, an extreme low-k dielectric layer, an oxide layer (e.g., a silicon dioxide layer), or the like. In various embodiments, the conductive wires 415 and the conductive vias 416 may, for example, be or comprise copper, aluminum, tungsten, ruthenium, titanium nitride, tantalum nitride, some other suitable material(s), or any combination of the foregoing.

In various embodiments, the plurality of 1S1MC stacks 150 is disposed within the interconnect structure 407. In various embodiments, the plurality of 1S1MC stacks 150 is disposed within one of the IMD layers 418. In further embodiments, the plurality of 1S1MC stacks 150 may be disposed within multiple IMD layers 418. Further, the plurality of bit lines 404 is disposed within the IMD layers 418 and overlies the plurality of 1S1MC stacks 150. The bit lines 404 are arranged in parallel with one another and each extend laterally in a first direction. The plurality of word lines 403 is disposed within the IMD layers 418 and underlies the plurality of 1S1MC stacks 150. In some embodiments, the word lines 403 are arranged in parallel with one another and each extend laterally in a second direction that is orthogonal to the first direction. In some embodiments, the bit lines 404 and the word lines 403 may, for example, respectively be or comprise aluminum, copper, tungsten, titanium, tantalum, some other suitable material(s), or any combination of the foregoing.

The plurality of 1S1MC stacks 150 are disposed vertically between the plurality of word lines 403 and the plurality of bit lines 404. In some embodiments, the 1S1MC stacks 150 are arranged in an array having a plurality of rows and a plurality of columns. An individual bit line in the plurality of bit lines 404 and an individual word line in the plurality of word lines 403 are coupled to each individual 1S1MC stacks 150. In yet further embodiments, each one of the 1S1MC stacks 150 comprises a memory cell 126 overlying a selector structure 144. In some embodiments, the selector structure 144 comprises a selector 146 and a first electrode 128, where the first electrode 128 is disposed between the selector 146 and a corresponding word line 403. In various embodiments, the memory cell 126 comprises a second electrode 136, a data storage layer 130, a buffer layer 134, and a third electrode 148, where the buffer layer 134 is disposed between the data storage layer 130 and a corresponding bit line 404. In yet further embodiments, an active metal layer (not shown) is disposed along an upper surface of the data storage layer 130 and is disposed vertically between the buffer layer 134 and the data storage layer 130. In some alternative embodiments, the first electrode 128 is omitted (not shown) such that the selector 146 directly contacts a corresponding word line 403. In further embodiments, the third electrode 148 is omitted (not shown) such that the buffer layer 134 directly contacts a corresponding bit line 404. In yet further embodiments, a plurality of air-gaps (not shown) may be disposed within one or more of the IMD layers 418 between adjacent memory cells within the plurality of 1S1MC stacks 150 (e.g., as illustrated and/or described in FIG. 3A).

Further, as illustrated in FIGS. 4B and 4C, the buffer layer 134 and the data storage layer 130 each extend laterally in the first direction. In some embodiments, outer sidewalls of the buffer layer 134 and outer sidewalls of the data storage layer 130 are respectively aligned with outer sidewalls of a corresponding bit line 404. In further embodiments, the buffer layer 134 and the data storage layer 130 continuously extends laterally over the plurality of word lines 403. In some embodiments, the third electrode 148 of each 1S1MC stack 150 is omitted (not shown) such that the data storage the buffer layer 134 directly contacts the corresponding bit line 404 and continuously extends along a bottom surface of the corresponding bit line 404. In yet further embodiments, a data storage structure of each one of the memory cells 126 may be disposed within the data storage layer 130 between the corresponding bit line 404 and an underlying word line 403. In some such embodiments, the data storage structure of each one of the memory cells 126 is defined by a portion of the data storage layer 130 spaced laterally between outer sidewalls of a corresponding selector 146. The data storage structure of each one of the memory cells 126 may have a high resistance state or a low resistance state.

FIGS. 5-11 illustrate cross-sectional views 500-1100 of some embodiments of a method for forming a memory device having a memory cell that includes a buffer layer overlying a data storage layer. Although the cross-sectional views 500-1100 shown in FIGS. 5-11 are described with reference to a method, it will be appreciated that the structures shown in FIGS. 5-11 are not limited to the method but rather may stand alone separate of the method. Further, although FIGS. 5-11 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 5:
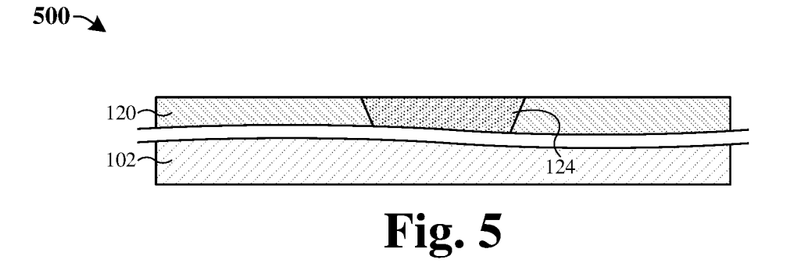
FIGS. 5-11 illustrate cross-sectional views of some embodiments of a method for forming a memory cell that includes a buffer layer overlying a data storage layer.

As shown in cross-sectional view 500 of FIG. 5, a dielectric layer 120 is formed over a substrate 102 and a bottom electrode via 124 is formed within the dielectric layer 120. In some embodiments, the dielectric layer 120 may, for example, be deposited by chemical vapor deposition (CVD), physical vapor deposition (PVD), atomic layer deposition (ALD), or another suitable deposition or growth process. In further embodiments, a method for forming the bottom electrode via 124 may include: patterning the dielectric layer 120 to form an opening within the dielectric layer 120; depositing (e.g., by CVD, PVD, sputtering, electroless plating, electro plating, or another suitable deposition or growth process) a conductive material over the dielectric layer 120 such that the conductive material fills the opening; and performing a planarization process (e.g., a chemical mechanical planarization (CMP) process) into the conductive material, thereby forming the bottom electrode via 124. In various embodiments, the substrate 102 may, for example, be or comprise a semiconductor body such as monocrystalline silicon/CMOS bulk, silicon-germanium (SiGe), a silicon-on-insulator (SOI), or another suitable material.

Figure 6:
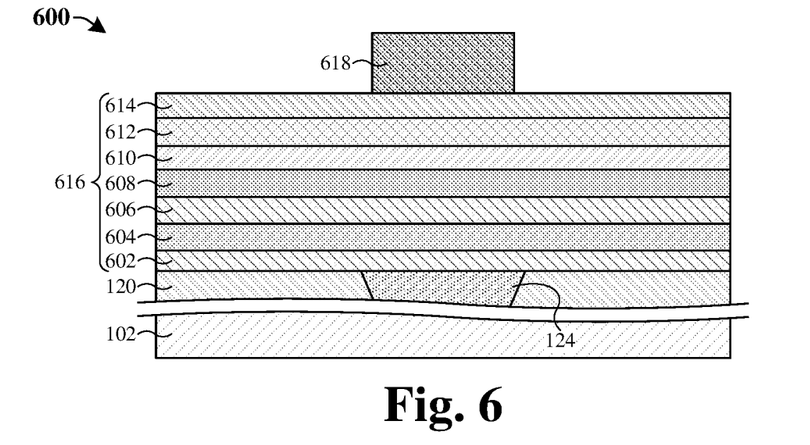

As shown in cross-sectional view 600 of FIG. 6, a memory cell layer stack 616 is formed over the dielectric layer 120 and the bottom electrode via 124. In some embodiments, the memory cell layer stack 616 comprises a first electrode layer 602, a selector layer 604, a second electrode layer 606, a data storage structure 608, a conductive layer 610, a buffer film 612, and a third electrode layer 614. In various embodiments, the conductive layer 610 may be referred to as an active metal film or an active metal layer. In further embodiments, the buffer film 612 may be referred to as a buffer layer, a diffusion barrier film, a diffusion barrier layer, or a second conductive layer. In an alternative embodiment, the buffer film 612 extends along and directly contacts a top surface of the data storage structure 608. In some such embodiments, the conductive layer 610 may be omitted (not shown), such that the buffer film 612 is sandwiched between the data storage structure 608 and the third electrode layer 614. In some embodiments, the layers and/or structures within the memory cell layer stack 616 may be formed or deposited by using a deposition process such as, for example, CVD, PVD, ALD, sputtering, co-sputtering, electroplating, electroless plating, or another suitable growth or deposition process. Further, after forming layers of the memory cell layer stack 616, a masking layer 618 may be formed over the memory cell layer stack 616. In various embodiments, the masking layer 618 may be or comprise a photoresist, a hard masking layer, or the like.

In various embodiments, the first, second, and third electrode layers 602, 606, 614 may, for example, respectively be or comprise tungsten, titanium, tantalum, titanium nitride, some other suitable material(s), or any combination of the foregoing. In some embodiments, the data storage structure 608 may, for example, be or comprise a chalcogenide, an oxide (e.g., silicon dioxide), a nitride, a high-k dielectric, some other suitable material, or any combination of the foregoing. In further embodiments, the conductive layer 610 may, for example, be or comprise aluminum, copper, zirconium, tellurium, some other suitable material(s), or any combination of the foregoing. In yet further embodiments, the buffer film 612 may, for example, be or comprise ruthenium, carbon, some other suitable material(s), or any combination of the foregoing. In some embodiments, the first electrode layer 602 may be referred to as a lower electrode layer, the second electrode layer 606 may be referred to as a middle electrode layer, and the third electrode layer 614 may be referred to as an upper electrode layer.

Figure 7:
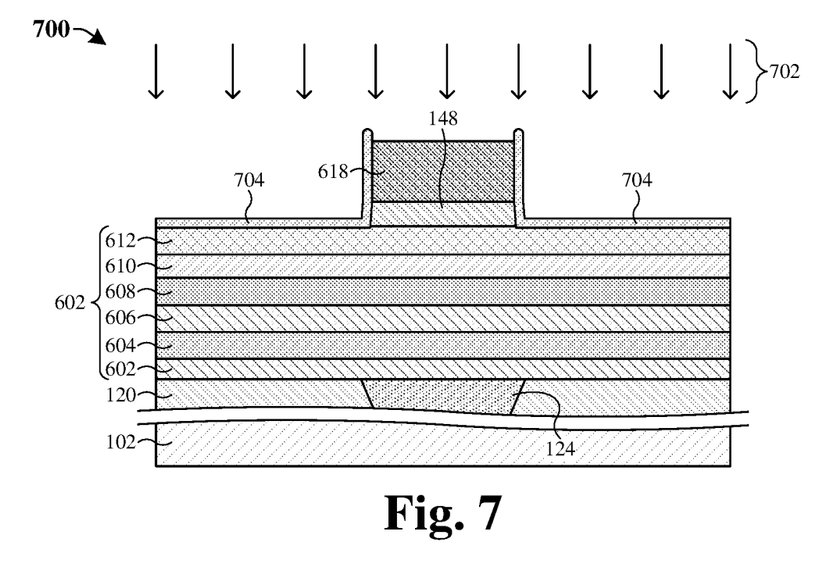

As shown in cross-sectional view 700 of FIG. 7, a first etch process is performed on the third electrode layer (614 of FIG. 6) according to the masking layer 618, thereby forming a third electrode 148 over the buffer film 612. In some embodiments, the first etch process may include performing a first plasma etch process according to the masking layer 618 to remove a portion of the third electrode layer (614 of FIG. 6) and expose an upper surface of the buffer film 612 in regions laterally offset from the masking layer 618. In some such embodiments, the first plasma etch process includes exposing the third electrode layer (614 of FIG. 6) to one or more first etchants 702. In various embodiments, the one or more first etchants 702 may comprise one or more fluorine-based etchants such as, for example, nitrogen trifluoride (e.g., $NF_3$), sulfur hexafluoride (e.g., $SF_6$), carbon tetrafluoride ($CF_4$), trifluoromethane (e.g., $CHF_3$), difluoromethane (e.g., $CH_2F_2$), fluoromethane (e.g., $CH_3F$), another suitable etchant, or any combination of the foregoing. In various embodiments, because the first etch process stops on the buffer film 612, the first etch process does not come into contact with the conductive layer 610 and/or the data storage structure 608 and will not lead to the formation of by-products (e.g., aluminum fluoride (e.g., $AlF_3$)) on an upper surface of the conductive layer 610 and/or an upper surface of the data storage structure 608. Thus, the buffer film 612 prevents the conductive layer 610 and/or the data storage structure 608 from being exposed to the one or more fluorine-base etchants.

In yet further embodiments, the one or more fluorine-based etchants react with the third electrode layer (614 of FIG. 6) and/or the buffer film 612, thereby forming a conductive material 704 along the upper surface of the buffer film 612, sidewalls of the third electrode 148, and/or sidewalls of the masking layer 618. In various embodiments, the conductive material 704 may be a by-product of the reaction between the one or more fluorine-based etchants and the third electrode layer (614 of FIG. 6) and/or the buffer film 612. In yet further embodiments, the buffer film 612 may be configured to prevent the conductive material 704 from diffusing to the conductive layer 610 and/or the data storage structure 608. In yet further embodiments, the conductive material 704 may not be formed during the first etch process such that the conductive material 704 is omitted (not shown).

Figure 8:
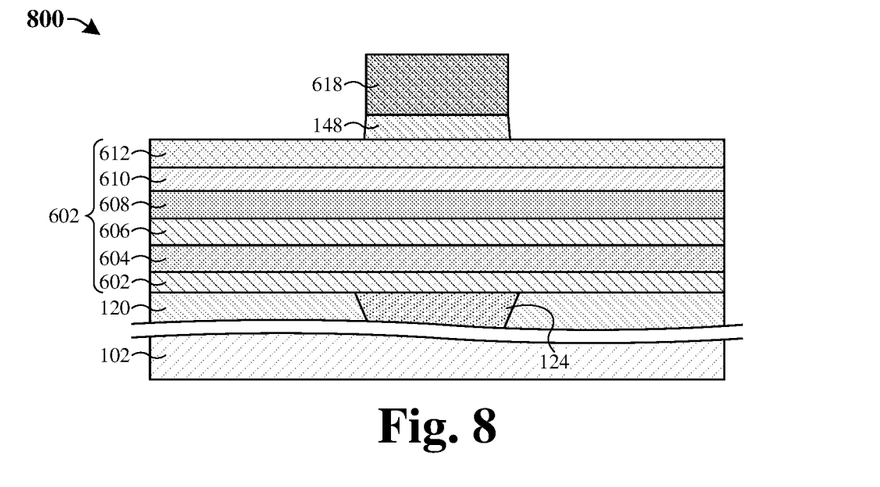

As shown in cross-sectional view 800 of FIG. 8, a wet cleaning process may be performed on the third electrode 148 and the buffer film 612 after the first etch process of FIG. 7. In various embodiments, the wet cleaning process may include exposing the conductive material (704 of FIG. 7), the buffer film 612, and/or the third electrode 148 to, for example, hydrofluoric acid, deionized water, or the like, thereby removing the conductive material (704 of FIG. 7). Because the buffer film 612 continuously laterally extends over the upper surface of the conductive layer 610 and/or the data storage structure 608, the wet cleaning process may not damage an interface(s) between the data storage structure 608 and the conductive layer 610 and/or the second electrode layer 606. This, in part, mitigates peeling between layers of the memory cell layer stack 616.

Figure 9:
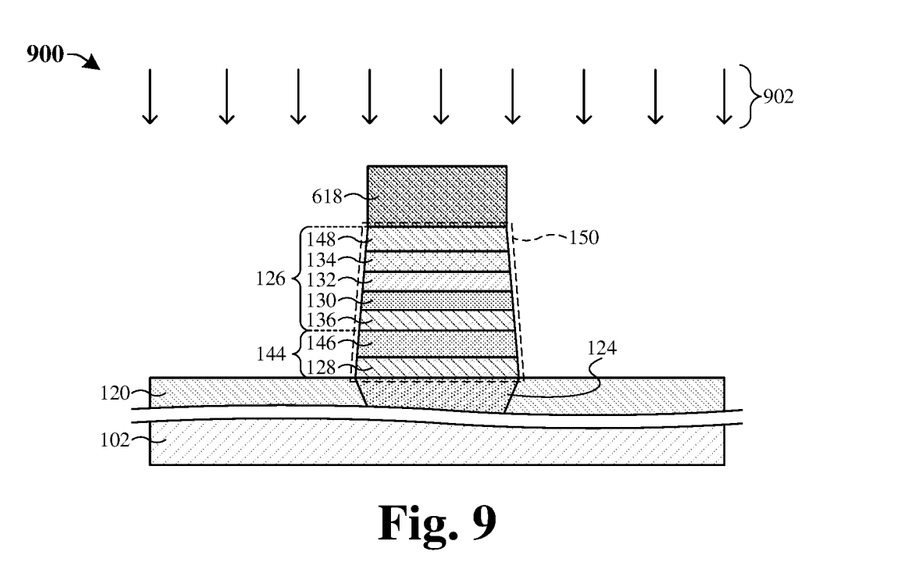

As shown in cross-sectional view 900 of FIG. 9, a second etch process is performed on the buffer film (612 of FIG. 8) and underlying layers of the memory cell layer stack 616 to define a 1S1MC stack 150 over the bottom electrode via 124. The 1S1MC stack 150 comprises a memory cell 126 and a selector structure 144. In some embodiments, the memory cell 126 includes a second electrode 136, a data storage layer 130, an active metal layer 132, a buffer layer 134, and the third electrode 148. In some embodiments, the selector structure 144 includes a selector 146 and a first electrode 128. In some embodiments, the second etch process may include performing a second plasma etch process according to the masking layer 618 to remove portions of the buffer film (612 of FIG. 8), portions of the conductive layer (610 of FIG. 8), portions of the data storage structure (608 of FIG. 8), portions of the second electrode layer (606 of FIG. 8), portions of the selector layer (604 of FIG. 8), and portions of the first electrode layer (602 of FIG. 8) laterally offset from the masking layer 618. In various embodiments, the second etch process includes exposing the buffer film (612 of FIG. 8) and underlying layers to one or more second etchants 902. In various embodiments, the one or more second etchants 902 may, for example, be or comprise chlorine (e.g., $Cl_2$), boron trichloride (e.g., $BCl_3$), sulfur dioxide (e.g., $SO_2$), carbonyl sulfide (e.g., COS), hydrogen bromide (e.g., HBr), dioxygen (e.g., $O_2$), another suitable etchant, or any combination of the foregoing. In some embodiments, the one or more second etchants 902 are fluorine free, such that the one or more second etchants 902 do not comprise fluorine-based etchant(s). In some such embodiments, by virtue of the one or more second etchants 902 being devoid of fluorine-based etchant(s), the one or more second etchants 902 may not react with the buffer layer 134 and/or underlying layers to form conductive materials along sidewalls of the 1S1MC stack 150. This, in part, mitigates layers within the 1S1MC stack 150 from being shorted together, thereby increasing a performance, endurance, and/or reliability of the memory cell 126. In various embodiments, the one or more first etchants (702 of FIG. 7) are different from the one or more second etchants 902.

Figure 10:
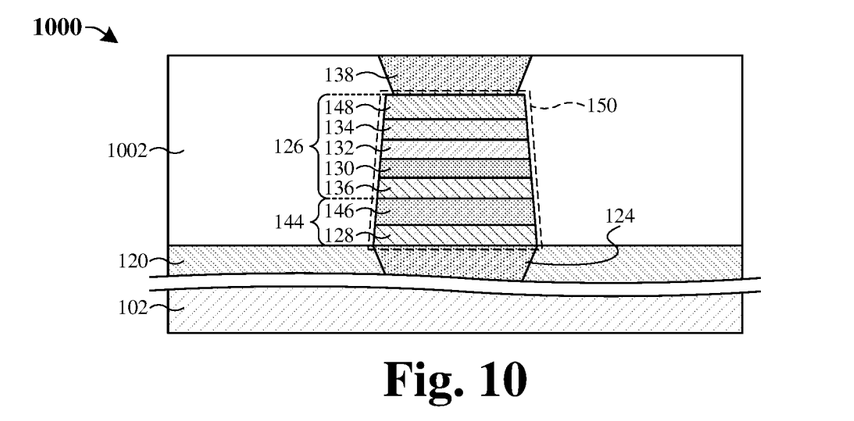

As shown in cross-sectional view 1000 of FIG. 10, a first inter-metal dielectric (IMD) layer 1002 is formed over and around the 1S1MC stack 150. In some embodiments, the first IMD layer 1002 may be formed by, for example, CVD, PVD, ALD, or another suitable deposition or growth process. In further embodiments, the first IMD layer 1002 may, for example, be or comprise silicon dioxide, a low-k dielectric material, an extreme low-k dielectric material, other suitable dielectric material(s), or any combination of the foregoing. Further, a top electrode via 138 is formed within the first IMD layer 1002 and over the 1S1MC stack 150. In various embodiments, the top electrode via 138 may be formed by a single damascene process, or another suitable formation process. In some embodiments, the top electrode via 138 may, for example, be or comprise copper, aluminum, tungsten, another suitable conductive material, or any combination of the foregoing.

Figure 11:
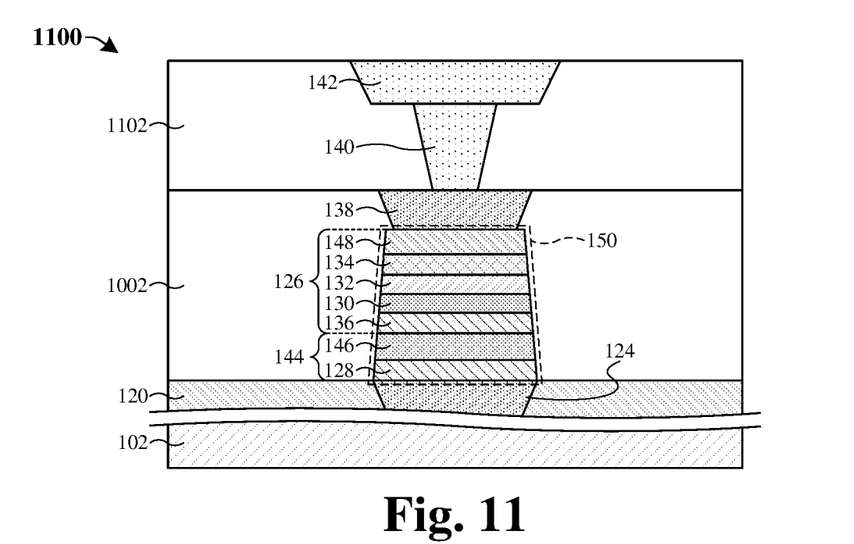

As shown in cross-sectional view 1100 of FIG. 11, a second IMD layer 1102 is formed over the first IMD layer 1002. In some embodiments, the second IMD layer 1102 may be formed by, for example, CVD, PVD, ALD, or another suitable deposition or growth process. In further embodiments, the second IMD layer 1102 may, for example, be or comprise silicon dioxide, a low-k dielectric material, an extreme low-k dielectric material, other suitable dielectric material(s), or any combination of the foregoing. Further, an upper conductive via 140 and an upper conductive wire 142 are formed within the second IMD layer 1102 and over the top electrode via 138. In some embodiments, the upper conductive via and wire 140, 142 may, for example, respectively be or comprise copper, aluminum, tungsten, ruthenium, titanium, tantalum, titanium nitride, tantalum nitride, another conductive material, or any combination of the foregoing. In further embodiments, the upper conductive via 140 and/or the upper conductive wire 142 may each be formed by a single damascene process, a dual damascene process, or another suitable formation process.

Figure 12:
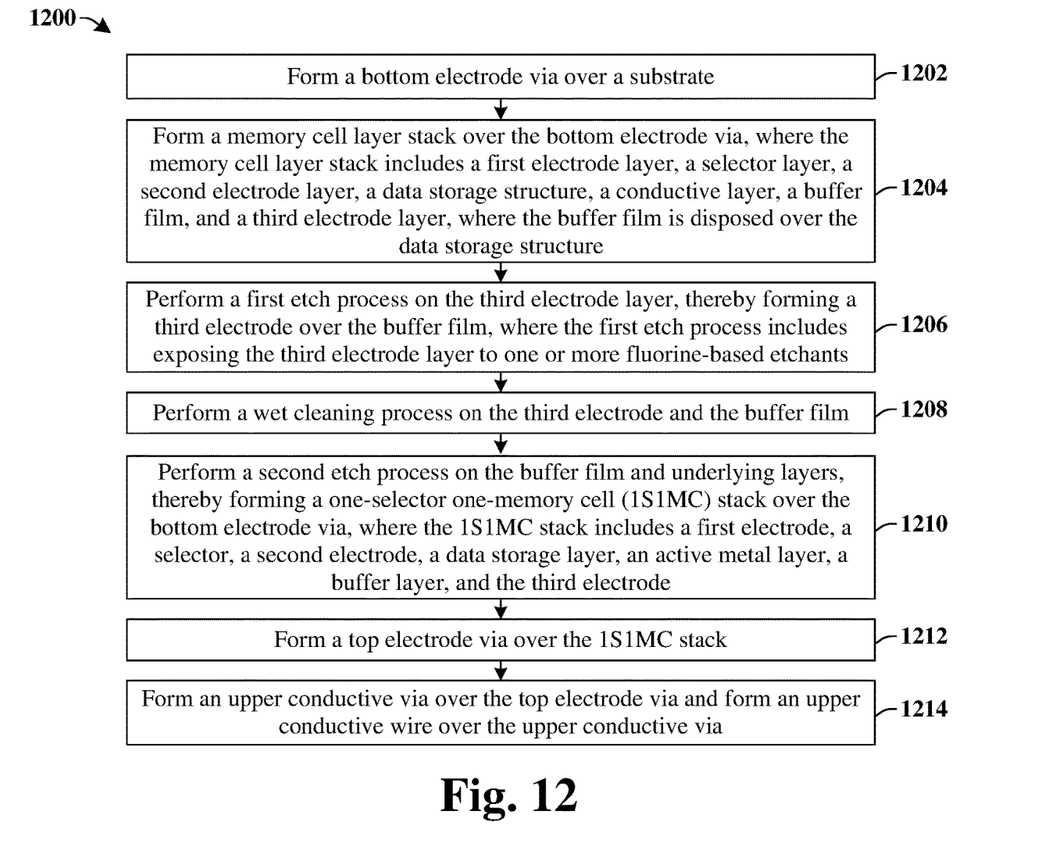
FIG. 12 illustrates a method in flowchart format that includes some embodiments of a method for forming a memory cell that includes a buffer layer overlying a data storage layer.

FIG. 12 illustrates a method 1200 of forming a memory device having a memory cell that includes a buffer layer overlying a data storage layer. Although the method 1200 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1202, a bottom electrode via is formed over a substrate. FIG. 5 illustrates a cross-sectional view 500 corresponding to some embodiments of act 1202.

At act 1204, a memory cell layer stack is formed over the bottom electrode via, where the memory cell layer stack includes a first electrode layer, a selector layer, a second electrode layer, a data storage structure, a conductive layer, a buffer film, and a third electrode layer. The buffer film is disposed over the data storage structure. FIG. 6 illustrates a cross-sectional view 600 corresponding to some embodiments of act 1204.

At act 1206, a first etch process is performed on the third electrode layer, thereby forming a third electrode over the buffer film. The first etch process includes exposing the third electrode layer to one or more fluorine-based etchants. FIG. 7 illustrates a cross-sectional view 700 corresponding to some embodiments of act 1206.

At act 1208, a wet cleaning process is performed on the third electrode and the buffer film. FIG. 8 illustrates a cross-sectional view 800 corresponding to some embodiments of act 1208.

At act 1210, a second etch process is performed on the buffer film and underlying layers, thereby forming a one-selector one-memory cell (1S1MC) stack over the bottom electrode via. The 1S1MC stack includes a first electrode, a selector, a second electrode, a data storage layer, an active metal layer, a buffer layer, and the third electrode. FIG. 9 illustrates a cross-sectional view 900 corresponding to some embodiments of act 1210.

At act 1212, a top electrode via is formed over the 1S1MC stack. FIG. 10 illustrates a cross-sectional view 1000 corresponding to some embodiments of act 1212.

At act 1214, an upper conductive via is formed over the top electrode via and an upper conductive wire is formed over the upper conductive via. FIG. 11 illustrates a cross-sectional view 1100 corresponding to some embodiments of act 1214.

Accordingly, in some embodiments, the present application relates to a memory cell including a first electrode, a data storage layer, a second electrode, and a buffer layer, in which the buffer layer overlies the data storage layer.

In various embodiments, the present application provides a memory device including: a substrate; a first electrode overlying the substrate; a data storage layer overlying the first electrode; a second electrode overlying the data storage layer, wherein a conductive bridge is selectively formable within the data storage layer to couple the first electrode to the second electrode; an active metal layer disposed between the data storage layer and the second electrode; and a buffer layer disposed between the active metal layer and the second electrode, wherein the buffer layer has a lower reactivity to oxygen than the active metal layer.

In various embodiments, the present application provides a memory device including: a dielectric structure overlying a substrate; a selector structure disposed within the dielectric structure, wherein the selector structure comprises a selector overlying a first electrode; and a first memory cell overlying the selector structure and disposed within the dielectric structure, wherein the first memory cell comprises a second electrode, a data storage layer overlying the second electrode, a third electrode overlying the data storage layer, and a buffer layer disposed between the data storage layer and the third electrode, wherein the buffer layer comprises a first conductive material and the third electrode comprises a second conductive material different than the first conductive material.

In various embodiments, the present application provides a method for forming a memory device, the method including forming a bottom electrode via over a substrate; forming a memory cell layer stack over the bottom electrode via, wherein the memory cell layer stack comprises a lower electrode layer, a data storage structure, a buffer layer, and an upper electrode layer, wherein the buffer layer is disposed between the data storage structure and the upper electrode layer; performing a first etch process on the upper electrode layer, thereby forming an upper electrode over the buffer layer, wherein the first etch process exposes an upper surface of the buffer layer; and performing a second etch process on the buffer layer, the data storage structure, and the lower electrode layer, thereby forming a memory cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
   a first electrode overlying a substrate;
   a data storage layer disposed on the first electrode;
   a second electrode overlying the data storage layer;
   a buffer layer disposed between the data storage layer and the second electrode; and
   a metal layer disposed between the buffer layer and the data storage layer, wherein the buffer layer directly contacts the metal layer.

2. The memory device of claim 1, wherein the buffer layer comprises a first conductive material.

3. The memory device of claim 2, wherein the second electrode comprises a second conductive material different from the first conductive material.

4. The memory device of claim 3, wherein the first conductive material comprises ruthenium or carbon and the second conductive material comprises tungsten, titanium, tantalum, titanium nitride, or tantalum nitride.

5. The memory device of claim 1, wherein the buffer layer has an amorphous structure.

6. The memory device of claim 1, wherein outer sidewalls of the buffer layer are aligned with outer sidewalls of the data storage layer.

7. The memory device of claim 1, further comprising:
   a conductive wire overlying the second electrode, wherein an outer sidewall of the buffer layer is aligned with an outer sidewall of the conductive wire.

8. An integrated circuit (IC) comprising:
   a dielectric structure overlying a substrate; and
   a first memory cell disposed within the dielectric structure, wherein the first memory cell comprises a first electrode, a data storage layer over the first electrode, a second electrode over the data storage layer, and a buffer layer disposed between the second electrode and the data storage layer, wherein the buffer layer comprises a first material and the second electrode comprises a second material different from the first material, wherein outer sidewalls of the second electrode are spaced between or aligned with outer sidewalls of the buffer layer, wherein the outer sidewalls of the second electrode and the outer sidewalls of the buffer layer are slanted relative to an upper surface of the first electrode.

9. The IC of claim 8, wherein a maximum width of the second electrode is less than a maximum width of the buffer layer.

10. The IC of claim 8, further comprising:
    a selector structure underlying the first electrode.

11. The IC of claim 10, wherein the outer sidewalls of the buffer layer are aligned with outer sidewalls of the selector structure.

12. The IC of claim 8, further comprising:
    a second memory cell disposed within the dielectric structure; and
    an air-gap disposed within the dielectric structure and spaced laterally between the first memory cell and the second memory cell.

13. The IC of claim 12, wherein the air-gap continuously extends from above a bottom surface of the buffer layer to a point below a bottom surface of the first electrode.

14. The IC of claim 8, wherein the second electrode comprises a diffusive species, and wherein the buffer layer is configured to mitigate diffusion of the diffusive species from the second electrode to the data storage layer.

15. An integrated circuit (IC) comprising:
    a selector structure over a substrate; and
    a memory cell on the selector structure, wherein the memory cell comprises a first electrode, a data storage layer over the first electrode, a second electrode over the data storage layer, and a buffer layer disposed between the second electrode and the data storage layer, wherein opposing sidewalls of the selector structure are aligned with or disposed between opposing sidewalls of the buffer layer.

16. The IC of claim 15, wherein grain sizes of the buffer layer are smaller than grain sizes of the second electrode.

17. The IC of claim 15, further comprising:
    a dielectric layer over the substrate and around the buffer layer, wherein an air-gap is disposed in the dielectric layer and is adjacent to the buffer layer, wherein a distance between the air-gap and the buffer layer is less than a width of the buffer layer.

18. The IC of claim 17, wherein a height of the air-gap is greater than a height of the memory cell.

19. The IC of claim 15, further comprising:
    a word line arranged between the selector structure and the substrate, wherein the word line comprises a first sidewall elongated in a first direction, wherein the data storage layer comprises a sidewall elongated in a second direction substantially orthogonal to the first direction, wherein a length of the sidewall of the data storage layer is greater than a length of a second sidewall of the word line that abuts the first sidewall of the word line.

20. The IC of claim 19, further comprising:
    a bit line over the memory cell and comprising a sidewall elongated in the second direction.

* * * * *